United States Patent
Kato et al.

(10) Patent No.: US 7,705,619 B2
(45) Date of Patent: Apr. 27, 2010

(54) SMALL PITCH BALL GRID ARRAY OF A PACKAGE ASSEMBLY FOR USE WITH CONVENTIONAL BURN-IN SOCKETS

(75) Inventors: Yousif Kato, Monterey, CA (US); Jeff Vesey, Santa Cruz, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/156,971

(22) Filed: Jun. 5, 2008
(Under 37 CFR 1.47)

(65) Prior Publication Data

US 2009/0079458 A1     Mar. 26, 2009

Related U.S. Application Data

(60) Provisional application No. 60/933,453, filed on Jun. 6, 2007.

(51) Int. Cl.
*G01R 31/02* (2006.01)
*G01R 31/26* (2006.01)

(52) U.S. Cl. .................................................. 324/754

(58) Field of Classification Search .......... 324/754–765
See application file for complete search history.

(56) References Cited

U.S. PATENT DOCUMENTS

| | | | | |
|---|---|---|---|---|
| 5,166,607 | A | * | 11/1992 | Long .......................... 324/760 |
| 5,953,214 | A | * | 9/1999 | Dranchak et al. ........... 361/767 |
| 7,420,380 | B2 | * | 9/2008 | Kasukabe et al. ........... 324/754 |
| 7,486,525 | B2 | * | 2/2009 | Knickerbocker ............ 361/760 |

* cited by examiner

*Primary Examiner*—Ha Tran T Nguyen
*Assistant Examiner*—Emily Y Chan
(74) *Attorney, Agent, or Firm*—Roeder & Broder LLP

(57) ABSTRACT

A package assembly (18) that is selectively coupled to a burn-in apparatus (228P) during a burn-in process includes a pin-out (20) having an array of contacts (22) including a set of first contacts (222F) and a set of second contacts (222S). The first contacts (222F) are required for the burn-in process, and are each adapted to be in contact with a corresponding contact member (232P) of the burn-in apparatus (228P) during the burn-in process. The second contacts (222S) are not required for the burn-in process. The second contacts (222S) do not contact any of the contact members (232P) during the burn-in process. The contact members (232P) are arranged at a first pitch. In various embodiments, the array of contacts (22) is arranged at a second pitch that is smaller than the first pitch.

24 Claims, 5 Drawing Sheets

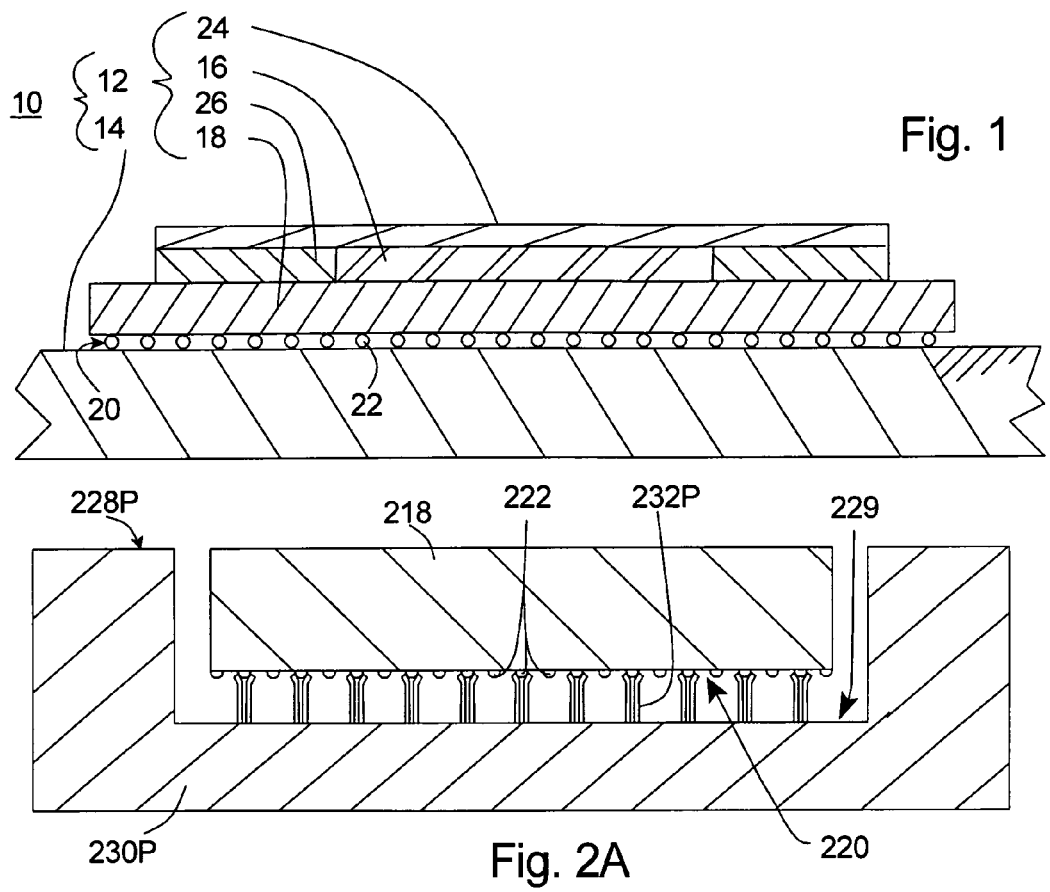
Fig. 1
Fig. 2A
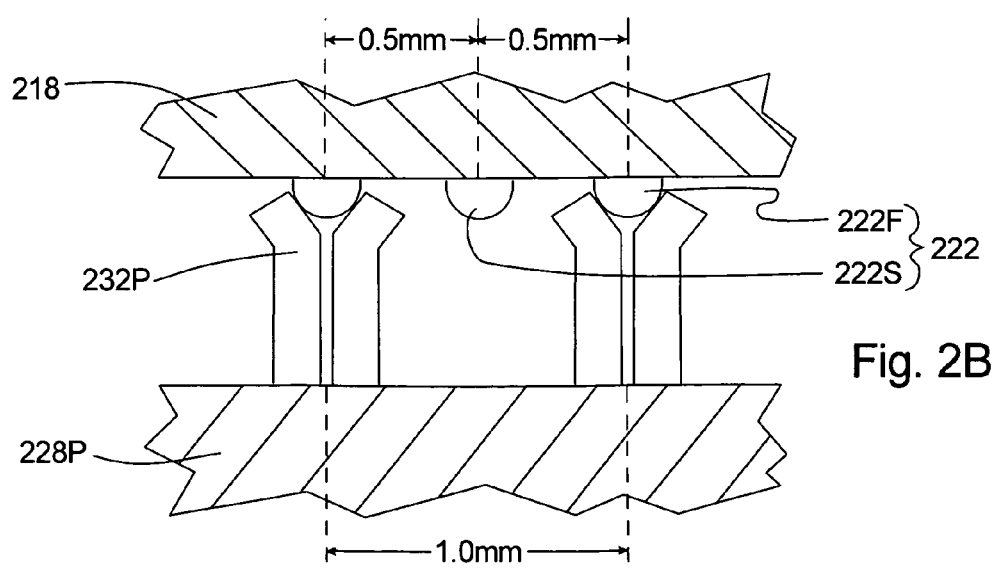
Fig. 2B

SMALL PITCH BALL GRID ARRAY OF A PACKAGE ASSEMBLY FOR USE WITH CONVENTIONAL BURN-IN SOCKETS

RELATED APPLICATION

This application claims benefit under 35 U.S.C. § 119(e) from U.S. Provisional Patent Application Ser. No. 60/933,453, filed Jun. 6, 2007, the entire contents of which are expressly incorporated herein by reference to the extent permitted.

BACKGROUND

Due to recent advances in microelectronics technology, integrated circuits (also individually known as a "die") now occupy less space while performing more functions. In order to provide electrical communication between the die and the external circuitry, the die can be secured to or contained within a package assembly that includes pins (also referred to herein as "contacts") on one or more external surfaces of the package. The combination of the die and the package assembly is also referred to herein as an integrated circuit assembly.

The package assembly is physically secured to a substrate such as a printed circuit board, and provides an electrical connection between the die and interconnect pads on the surface of the substrate. To effectuate such a connection, a small solder ball can be secured to and/or forms a portion of each contact on the package assembly. These types of solder ball arrangements are often described as ball grid arrays ("BGA"). Today's conventional BGA devices can have spacings (also referred to herein as the "pitch") of approximately 1.0 mm from center-to-center of adjacent solder balls. However, certain BGA devices can have decreased pitches (higher density of contacts) of less than 1.0 mm. For example, some BGA devices can have pitches of approximately 0.75 mm, 0.50 mm, or even smaller pitches.

To reduce the potential for selling defective products, the package assembly can be tested by a process that intentionally stresses the components to force early failures. In the semiconductor industry, this process is known as "burn-in", and package assemblies are stressed using extremes of temperature and/or voltage with the objective of forcing failure of inherently weak components so that these defective devices can be sorted and discarded. For burn-in, one or more package assemblies to be tested are removeably mounted on or in a burn-in apparatus (also sometimes referred to herein as a socket board) that includes one or more sockets, each providing contact members that serve as electrical points of contact for each of the contacts of the package assembly while the package assembly is functionally tested, stressed and/or evaluated.

Unfortunately, the cost of manufacturing burn-in apparatuses that can accommodate higher density BGA devices, e.g., pitches of less than 1.0 millimeters, is relatively high compared to standard-sized burn-in apparatuses that accommodate BGA devices with pitches of 1.0 millimeters or greater. Additionally, reliably manufacturing burn-in apparatuses for small pitch BGA devices has become extremely challenging due to size limitations and constraints on the structures required by the burn-in apparatuses. For example, typical burn-in apparatuses include contact members having relatively large dimensions. As pitches of BGA devices decrease, inherent space limitations are imposed on the burn-in apparatuses. As a result, accommodating decreased-pitch BGA devices is increasingly difficult without significant modification of conventional burn-in apparatus structure and technology.

SUMMARY

The present invention is directed toward a package assembly that electrically connects an integrated circuit to a substrate. The package assembly is selectively coupled to a burn-in apparatus during a burn-in process. The burn-in apparatus has a plurality of substantially evenly spaced apart contact members that are arranged at a first pitch. The package assembly includes a pin-out that is adapted to electrically communicate with the substrate. In certain embodiments, the pin-out includes an array of contacts including a set of first contacts and a set of second contacts. The first contacts are used for the burn-in process, and are each adapted to be in contact with a corresponding contact member of the burn-in apparatus during the burn-in process. The second contacts are not required for the burn-in process. In one embodiment, both the first contacts and the second contacts are used for normal functionality of the package assembly. The second contacts do not contact any of the contact members of the burn-in apparatus during the burn-in process. In various embodiments, the array of contacts is arranged at a second pitch that is smaller than the first pitch.

In some embodiments, the second pitch is not greater than approximately 50, 33⅓, or 25 percent of the first pitch. In one embodiment, at least approximately 64, 81 or 88 percent of all of the contacts are second contacts. In non-exclusive, alternative embodiments, the second pitch is less than approximately 1.0 millimeters, not greater than approximately 0.50 millimeters, not greater than approximately 0.33 millimeters and/or not greater than approximately 0.25 millimeters. In certain embodiments, the first pitch is approximately 1.0 millimeters. In some embodiments, at least some of the first contacts are separated from one another by at least one second contact.

In certain embodiments, at least some of the first contacts are configured to enable a self-test of the package assembly during the burn-in process. Further, in certain embodiments, none of the second contacts is configured to enable a self-test of the package assembly during the burn-in process.

The present invention is also directed toward a method for manufacturing a package assembly of an integrated circuit package.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 1 is a simplified cross-sectional view of an integrated circuit assembly including a package assembly having features of the present invention;

FIG. 2A is a simplified cross-sectional view of a prior art burn-in burn-in apparatus, and one embodiment of the package assembly having features of the present invention;

FIG. 2B is a detailed cross-sectional view of a portion of the prior art burn-in burn-in apparatus and the package assembly illustrated in FIG. 2A;

DESCRIPTION

Figure 3:
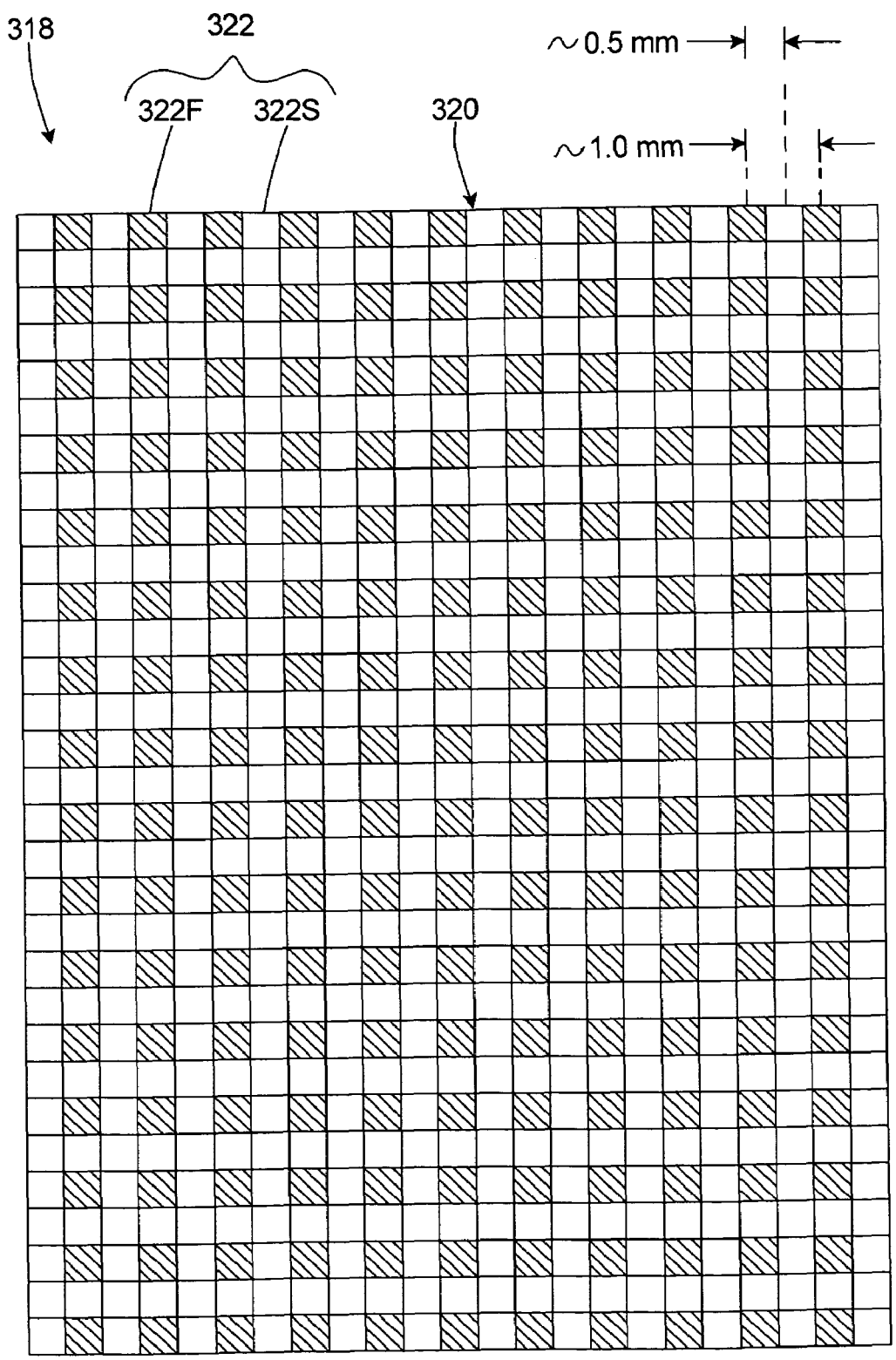
FIG. 3 is a simplified schematic view of the package assembly including a first embodiment of a pin-out.

FIG. 1 is a simplified side view of an integrated circuit assembly 10 including an integrated circuit package 12 and an adjacent substrate 14. In this embodiment, the integrated circuit package 12 includes an integrated circuit 16 and a package assembly 18. The integrated circuit 16 is in electrical communication with the package assembly 18. In certain embodiments, the integrated circuit 16 is directly or indirectly secured to the package assembly 18.

In the embodiment illustrated in FIG. 1, the package assembly 18 includes a pin-out 20 than can include a ball grid array (BGA), as one non-exclusive example. The pin-out 20 can electrically and/or mechanically couple the package assembly 18 to the substrate 14. The pin-out 20 can include a plurality of contacts 22 that are adapted to be directly or indirectly secured to the substrate 14. In one non-exclusive embodiment, the contacts can be solder balls. In various embodiments, the contacts 22 can include ground pins, power pins and/or various types of signal pins. In the embodiments provided herein, different types of contacts 22 are strategically arranged in various patterns and arrays to increase compatibility with less expensive and more prevalent burn-in apparatuses that are used for testing the integrated circuit package 12, as explained in greater detail below.

The substrate 14 supports the integrated circuit package 12. In certain embodiments, the substrate 14 is a printed circuit board (PCB). In alternative embodiments, the substrate 14 can be another suitable type of supporting structure known to those skilled in the art.

In certain embodiments such as that illustrated in FIG. 1, the integrated circuit package 12 can also include a heat spreader 24 and/or one or more insulators 26. In one embodiment, the heat spreader can be positioned near the integrated circuit 16 and can spread, distribute or otherwise disperse heat to protect the integrated circuit 16 and/or the package assembly 18 from being subjected to excessive temperatures, for example. The heat spreader 24 can be formed from a material having a relatively high thermal conductivity. For example, the heat spreader 24 can be formed from a metallic material, or any other suitable material.

The one or more insulators 26 can be positioned between the heat spreader 24 and the package assembly 18. The insulator 26 can provide a protective barrier for an otherwise exposed edge of the integrated circuit 16. Additionally, the insulator 26 and can fill the gap that would otherwise exist between the heat spreader 24 and the package assembly 18 to provide structural stability to the integrated circuit package 12. In one embodiment, the insulator 26 can be formed from a substantially non-conductive material, such as a dielectric material or another suitable material.

It is recognized that the integrated circuit package 12 can be configured differently than that illustrated in FIG. 1, as known generally by those skilled in the art. For example, the integrated circuit package can omit the heat spreader 24 and/or the insulators 26. Additionally, the integrated circuit 16 can have a somewhat similarly-sized footprint as the package assembly 18, which is sometimes referred to in the art as a "chip-scale package". It is understood that the features of the present invention provided herein are equally operable with numerous designs of the integrated circuit package 12, and that no limitations are intended by illustrating one embodiment of the integrated circuit package 12 such as that shown in FIG. 1.

FIG. 2A is a simplified cross-sectional view of a prior art burn-in burn-in apparatus 228P and one embodiment of the package assembly 218. The burn-in apparatus 228P is a device that thermally and/or electrically stresses package assemblies to test for proper functionality and for overall quality control purposes. A typical burn-in apparatus 228P can include one or more sockets 229P that each selectively retains package assembly 218 or integrated circuit package 12 (illustrated in FIG. 1) during the burn-in process.

One embodiment of the prior art burn-in apparatus 228P can include a housing 230P forming a plurality of sockets 229P (only one socket 229P is illustrated in FIG. 2A) and an array of substantially evenly-spaced contact members 232P. The contact members 232P are designed to contact each of the contacts of a package assembly, which have the same center-to-center spacing (also referred to herein as the "pitch") as the contact members 232P of the burn-in apparatus 228P. The contact between the contact members 232P and the pins of the package assembly allows electrical communication between the package assembly and the burn-in apparatus 228P.

However, in the embodiments described herein, such as that shown in FIG. 2A, the contacts 222 on the pin-out 220 of the package assembly 218 are more densely packed, e.g., have a smaller pitch, than the contact members 232P of the burn-in apparatus 228P. Therefore, in this embodiment, only certain contacts 222 are directly contacted by the contact members 232P when the package assembly 218 is positioned within the socket 229P of the burn-in apparatus 228P, as explained in greater detail below.

FIG. 2B is a detailed cross-sectional view of a portion of the prior art burn-in apparatus 228P and one embodiment of the package assembly 218 illustrated in FIG. 2A. As illustrated in FIG. 2B, the contact members 232P of the standard burn-in apparatus 228P have a pitch of approximately 1.0 millimeters. In contrast, in the embodiment illustrated in FIG. 2B, the contacts 222 of the package assembly 218 have a pitch of approximately 0.5 millimeters. Thus, in this embodiment, only certain contacts 222 are in direct contact with the contact members 232P, while other contacts 222 do not directly contact the contact members 232P, as illustrated in FIGS. 2A and 2B.

For ease of discussion, the contacts 222 that contact the contact members 232P are referred to herein as first contacts 222F and the contacts that do not contact the contact members 232P are referred to herein as second contacts 222S.

With the designs of the package assemblies 218 provided herein, no modification of the burn-in apparatuses 228P for performing burn-in are necessary despite a disparity between the pitch of the burn-in apparatus and the pitch of the package assembly 218.

FIG. 3 is a simplified bottom view diagram of a first embodiment of a package assembly 318 having a pin-out 320. In this embodiment, the pin-out 320 includes a plurality of substantially evenly spaced contacts 322 (represented by squares in FIG. 3), which include first contacts 322F (represented by shaded squares in FIG. 3) and second contacts 322S (represented by unshaded squares in FIG. 3). As indicated previously, the first contacts 322F are positioned to contact the contact members 232P (illustrated in FIG. 2A) of a standard pitch burn-in apparatus 228P when the package assembly 318 is positioned within the burn-in apparatus 228P. The second contacts 322S are positioned so that no contact occurs between the second contacts 322S and the contact members 232P of the burn-in apparatus 228P when the package assembly 318 is positioned within the burn-in apparatus 228P.

The contacts 322 of the package assembly 318 each are associated with a particular function of the package assembly 318. For example, the different types of contacts can be associated with functions which include power, ground, input interface signals, response interface signals, output interface signals, request interface signals, clocks, and other miscellaneous functionalities. For purposes of the burn-in process, only certain contacts 322F need to be electrically connected to the burn-in apparatus 228P in order to test the robustness and/or functionality of the package assembly 318.

In certain embodiments of the package assembly 318, the first contacts 322F are configured to enable a self-test of the package assembly 318 during burn-in. On the other hand, the second contacts 322S are not configured to enable a self-test during burn-in. For example, a package assembly having a ball grid array of 23×31 contacts may use a relatively large number of those contacts as power and ground contacts. However, for the purpose of performing the self-test on the package assembly, voltage from the burn-in apparatus 228P need only be applied to a relatively low percentage of those power and ground contacts during burn-in in order for the self-test to proceed. Stated another way, not all of the power and ground contacts are required for the self-test. Thus, only certain power and ground contacts will contact a corresponding contact member 232P of the burn-in apparatus 228P during burn-in.

Additionally, voltage from the burn-in apparatus 228P need only be applied to certain signal contacts during burn-in so that the self-test can proceed. Thus, only certain signal contacts will each contact a corresponding contact member 232P of the burn-in apparatus 228P during burn-in. As provided above, these power, ground and signal contacts that are utilized during burn-in are referred to as the first contacts 322F.

In certain embodiments, the pitch of all of the contacts 322 of the package assembly 318 is less than 1.0 millimeters. In the embodiment illustrated in FIG. 3, the pitch of all of the contacts 322 of the package assembly 318 is approximately 0.5 millimeters, or not greater than approximately 50 percent of the pitch of the contact members 232P. However, the pitch of just the first contacts 322F is approximately 1.0 millimeters, which is substantially similar or identical to the pitch of the contact members 232P of the burn-in apparatus 228P. Further, the positioning of the first contacts 322F aligns with the positioning of the contact members 232P of the burn-in apparatus 228P. Therefore, the first contacts 322F, which are necessary for performing the self-test, each contact a corresponding contact member 232P of the burn-in apparatus 228P during burn-in. Conversely, the second contacts 322S do not contact any of the contact members 232P of the burn-in apparatus 228P during burn-in. In this embodiment, at least approximately 64 percent of all of the contacts 322 are second contacts 322S.

It is recognized that other criteria can be used to determine which contacts 322 are to be first contacts 322F and which contacts 322 are to be second contacts 322S. It may be desirous to apply voltage to and/or stress only certain other types of contacts 322 or combination of types of contacts 322 for reasons other than performing a self-test.

Figure 4:
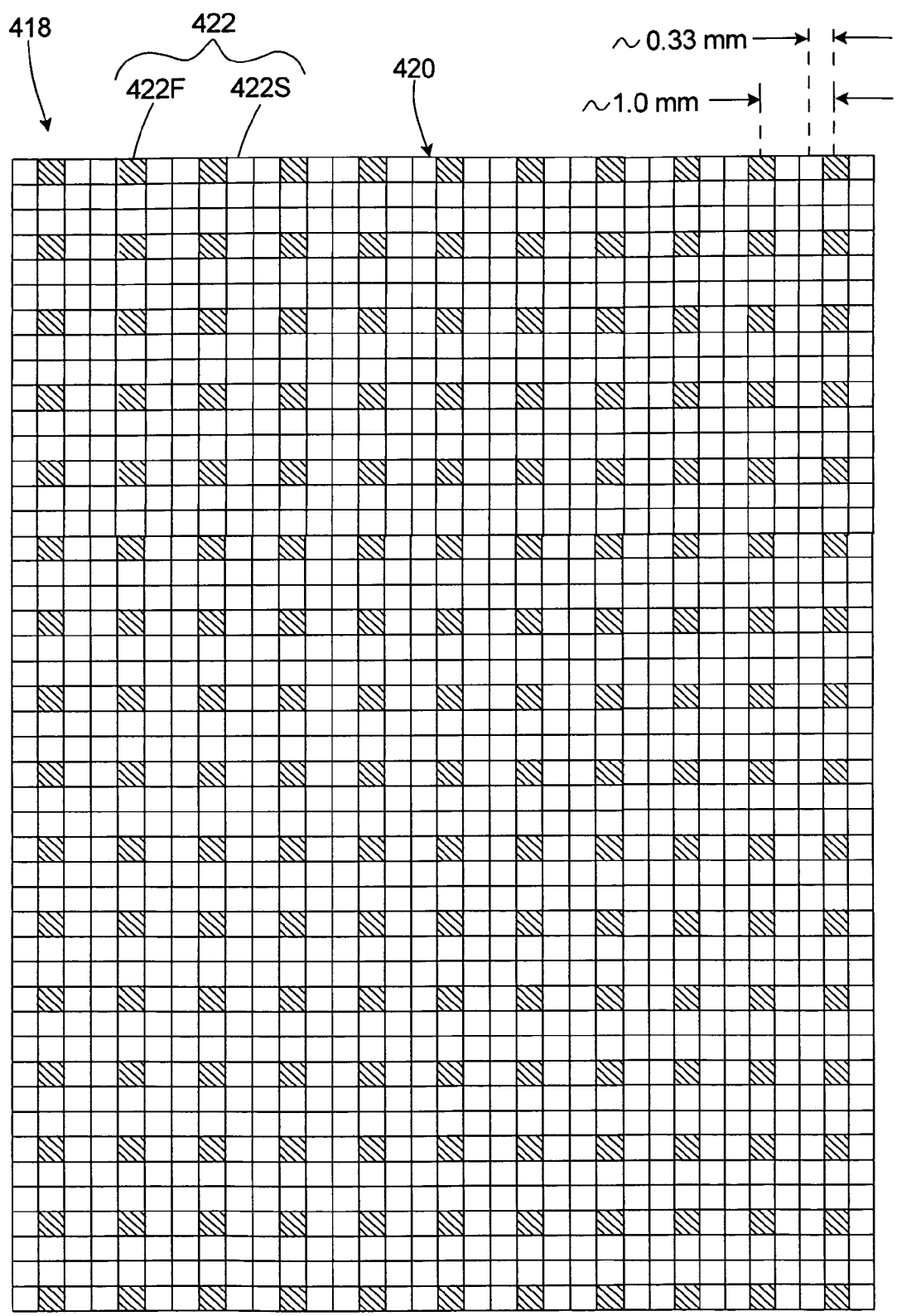
FIG. 4 is a simplified schematic view of the package assembly including a second embodiment of the pin-out.

FIG. 4 is a simplified bottom view diagram of another embodiment of a package assembly 418 having a pin-out 420. In this embodiment, the pin-out 420 includes a plurality of substantially evenly spaced contacts 422 (represented by squares in FIG. 4), which include first contacts 422F (represented by shaded squares in FIG. 4) and second contacts 422S (represented by unshaded squares in FIG. 4). As indicated previously, the first contacts 422F are positioned to contact the contact members 232P (illustrated in FIG. 2A) of a standard pitch burn-in apparatus 228P when the package assembly 418 is positioned within the burn-in apparatus 228P. The second contacts 422S are positioned so that no contact occurs between the second contacts 422S and the contact members 232P of the burn-in apparatus 228P when the package assembly 418 is positioned within the burn-in apparatus 228P.

In the embodiment illustrated in FIG. 4, the pitch of all of the contacts 422 of the package assembly 418 is approximately 0.33 millimeters, or not greater than approximately 33⅓ percent of the pitch of the contact members 232P. However, the pitch of just the first contacts 422F is approximately 1.0 millimeters, which is substantially similar or identical to the pitch of the contact members 232P of the burn-in apparatus 228P. Further, the positioning of the first contacts 422F aligns with the positioning of the contact members 232P of the burn-in apparatus 228P. Therefore, the first contacts 422F, which are necessary for performing the self-test or another relevant function, each contact a corresponding contact member 232P of the burn-in apparatus 228P during burn-in. Conversely, the second contacts 422S do not contact any of the contact members 232P of the burn-in apparatus 228P during burn-in. In this embodiment, at least approximately 81 percent of all of the contacts 422 are second contacts 422S.

Figure 5:
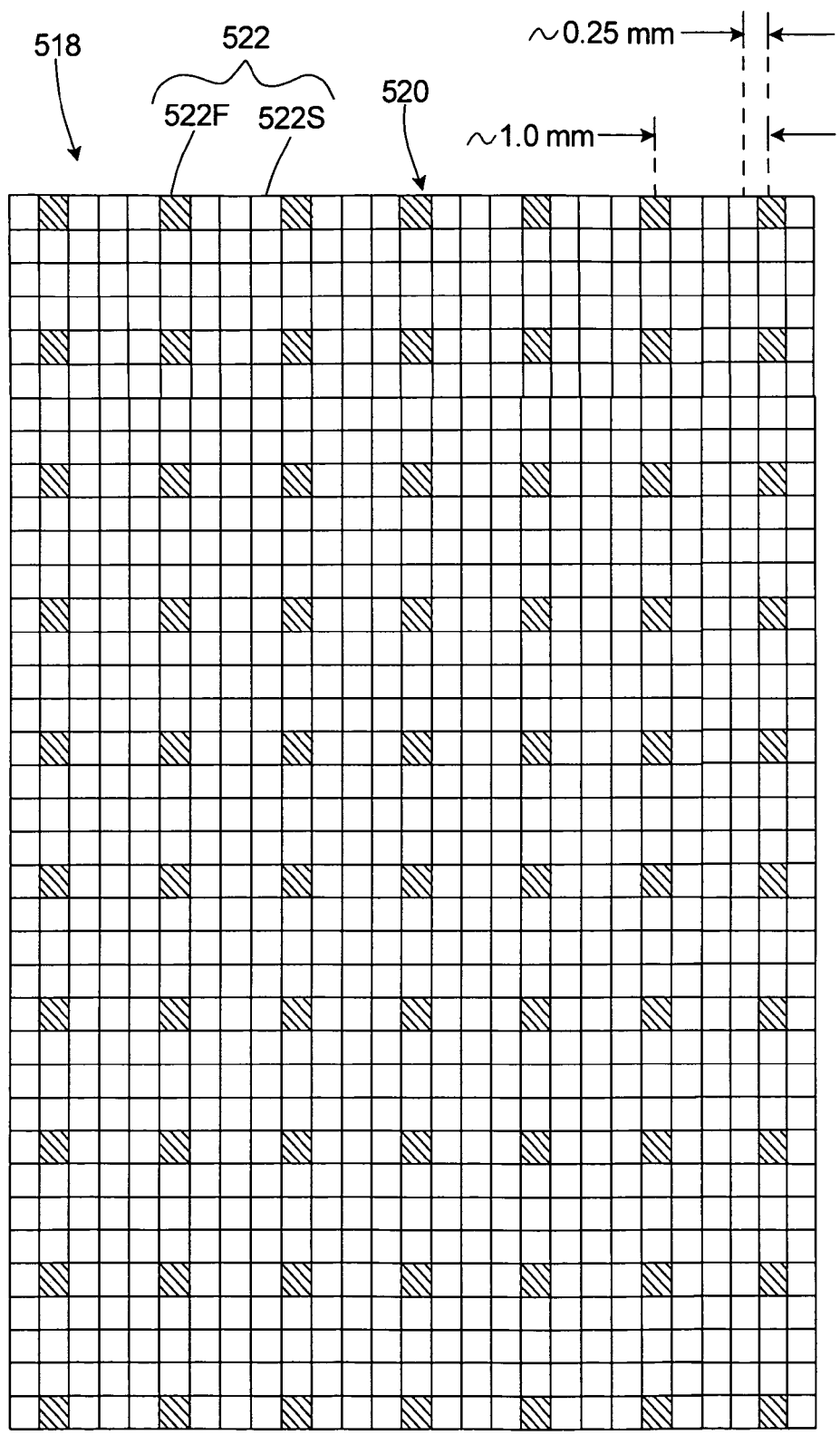
FIG. 5 is a simplified schematic view of the package assembly including a third embodiment of the pin-out.

FIG. 5 is a simplified bottom view diagram of yet another embodiment of a package assembly 518 having a pin-out 520. In this embodiment, the pin-out 520 includes a plurality of substantially evenly spaced contacts 522 (represented by squares in FIG. 5), which include first contacts 522F (represented by shaded squares in FIG. 5) and second contacts 522S (represented by unshaded squares in FIG. 5). As indicated previously, the first contacts 522F are positioned to contact the contact members 232P (illustrated in FIG. 2A) of a standard pitch burn-in apparatus 228P when the package assembly 518 is positioned within the burn-in apparatus 228P. The second contacts 522S are positioned so that no contact occurs between the second contacts 522S and the contact members 232P of the burn-in apparatus 228P when the package assembly 518 is positioned within the burn-in apparatus 228P.

In the embodiment illustrated in FIG. 5, the pitch of all of the contacts 522 of the package assembly 518 is approximately 0.25 millimeters, or not greater than approximately 25 percent of the pitch of the contact members 232P. However, the pitch of just the first contacts 522F is approximately 1.0 millimeters, which is substantially similar or identical to the pitch of the contact members 232P of the burn-in apparatus 228P. Further, the positioning of the first contacts 522F aligns with the positioning of the contact members 232P of the burn-in apparatus 228P. Therefore, the first contacts 522F, which are necessary for performing the self-test or another relevant function, each contact a corresponding contact member 232P of the burn-in apparatus 228P during burn-in. Conversely, the second contacts 522S do not contact any of the contact members 232P of the burn-in apparatus 228P during burn-in. In this embodiment, at least approximately 88 percent of all of the contacts 522 are second contacts 522S.

Although various embodiments have been provided and described herein, it is understood that other pitches of the package assembly can be utilized provided that the contacts necessary for burn-in are positioned in accordance with the teachings herein. Further, although the burn-in apparatus described herein references a 1.0 millimeter pitch, the present invention can be utilized with burn-in apparatuses having pitches greater than or less than 1.0 millimeters, provided that only certain contacts are necessary for burn-in, and these contacts are positioned at substantially the same pitch as the contact members of the burn-in apparatus.

Figure 6:
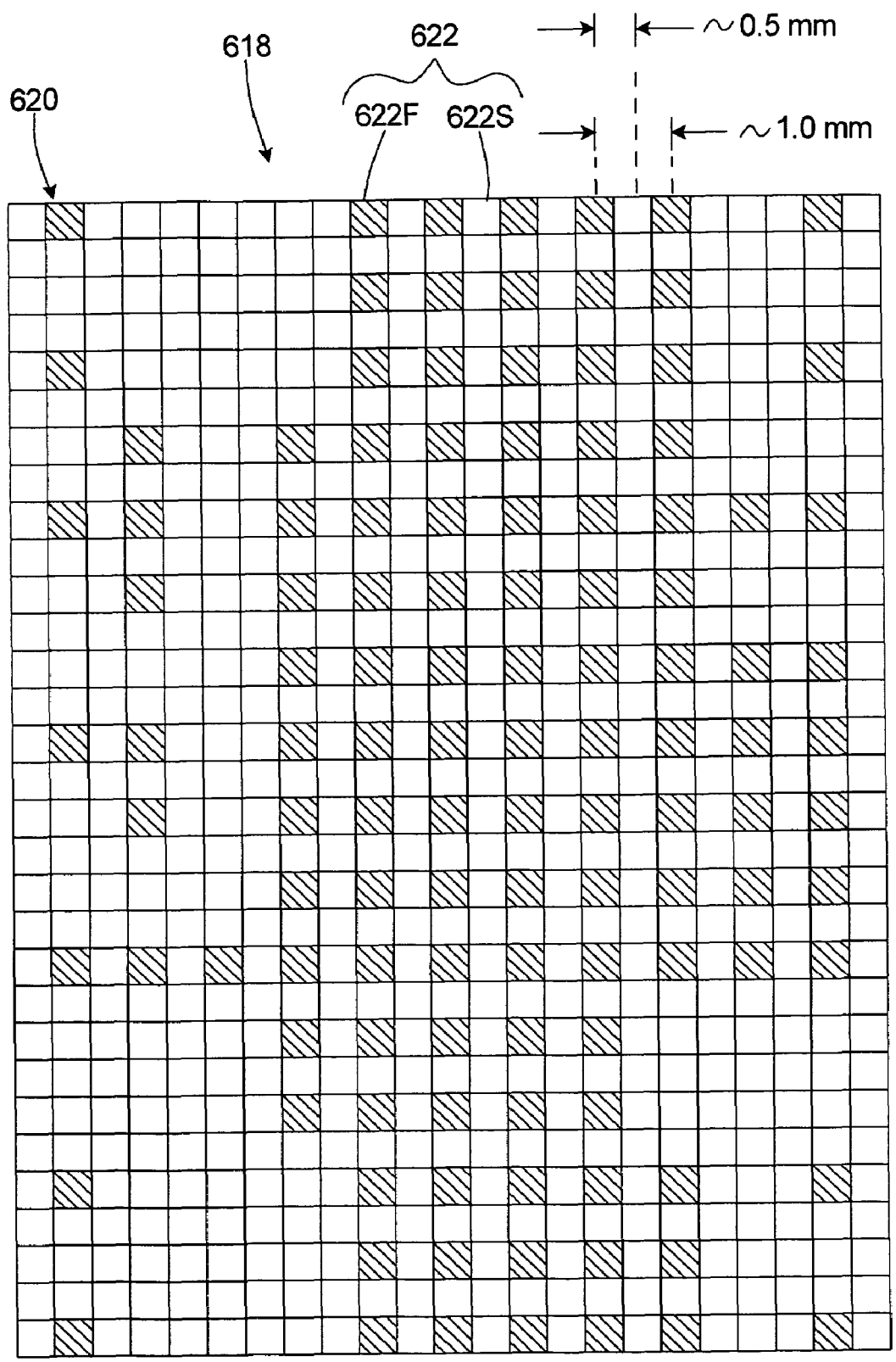
FIG. 6 is a simplified schematic view of the package assembly including a fourth embodiment of the pin-out.

FIG. 6 is a simplified bottom view diagram of still another embodiment of a package assembly 618 having a pin-out 620. In this embodiment, the pin-out 620 includes a plurality of substantially evenly spaced contacts 622 (represented by squares in FIG. 6), which include first contacts 622F (represented by shaded squares in FIG. 6) and second contacts 622S (represented by unshaded squares in FIG. 6). As indicated previously, the first contacts 622F are positioned to contact the contact members 232P (illustrated in FIG. 2A) of a standard pitch burn-in apparatus 228P when the package assembly 618 is positioned within the burn-in apparatus 228P. The second contacts 622S are positioned so that no contact occurs between the second contacts 622S and the contact members 232P of the burn-in apparatus 228P when the package assembly 618 is positioned within the burn-in apparatus 228P.

In the embodiment illustrated in FIG. 6, the pitch of all of the contacts 622 of the package assembly 618 is approximately 0.50 millimeters. However, the minimum pitch of the first contacts 622F is approximately 1.0 millimeters, which is substantially similar or identical to the pitch of the contact members 232P of the burn-in apparatus 228P. In this embodiment, although the first contacts are not necessary all evenly spaced, i.e. some adjacent first contacts 622F are greater than 1.0 millimeters apart center-to-center, the positioning of the first contacts 622F aligns with the positioning of the contact members 232P of the burn-in apparatus 228P. Therefore, each of the first contacts 622F, which are necessary for performing the self-test or another relevant function, contacts a corresponding contact member 232P of the burn-in apparatus 228P during burn-in. On the other hand, some of the contact members 232P of the burn-in apparatus 228P do not contact any first contacts 622F. Similar to the previous embodiments, the second contacts 622S do not contact any of the contact members 232P of the burn-in apparatus 228P during burn-in.

While the particular integrated circuit assemblies 10 as herein shown and disclosed in detail are fully capable of obtaining the objects and providing the advantages herein before stated, it is to be understood that they are merely illustrative of one or more embodiments and that no limitations are intended to the details of construction or design herein shown other than as described in the appended claims.

What is claimed is:

1. A package assembly that electrically connects an integrated circuit to a substrate, the package assembly being selectively coupled to a burn-in apparatus during a burn-in process, the burn-in apparatus having a plurality of substantially evenly spaced apart contact members that are arranged at a first pitch, the package assembly comprising:
a pin-out including an array of contacts that are adapted to electrically communicate with the substrate, the array of contacts being arranged to include (i) a set of first contacts that are required for the burn-in process, the first contacts each being in contact with a corresponding contact member of the burn-in apparatus during the burn-in process, and (ii) a set of second contacts that are not required for the burn-in process, the second contacts not contacting any of the contact members of the burn-in apparatus during the burn-in process, the array of contacts being arranged at a second pitch that is smaller than the first pitch.

2. The package assembly of claim 1 wherein the second pitch is not greater than approximately 50 percent of the first pitch.

3. The package assembly of claim 2 wherein at least approximately 64 percent of all of the contacts are second contacts.

4. The package assembly of claim 1 wherein the second pitch is not greater than approximately 33⅓ percent of the first pitch.

5. The package assembly of claim 4 wherein at least approximately 81 percent of all of the contacts are second contacts.

6. The package assembly of claim 1 wherein the second pitch is not greater than approximately 0.50 millimeters.

7. The package assembly of claim 1 wherein the second pitch is not greater than approximately 0.33 millimeters.

8. The package assembly of claim 1 wherein the second pitch is not greater than approximately 0.25 millimeters.

9. The package assembly of claim 1 wherein the second pitch is less than 1.0 millimeters.

10. The package assembly of claim 1 wherein the first pitch is approximately 1.0 millimeters.

11. The package assembly of claim 1 wherein at least some of the first contacts are separated from one another by one second contact.

12. The package assembly of claim 1 wherein at least some of the first contacts are configured to enable a self-test of the package assembly during the burn-in process.

13. The package assembly of claim 12 wherein none of the second contacts is configured to enable a self-test of the package assembly during the burn-in process.

14. A package assembly that electrically connects an integrated circuit to a substrate, the package assembly being selectively coupled to a burn-in apparatus during a burn-in process, the burn-in apparatus having a plurality of substantially evenly spaced apart contact members that are arranged at a first pitch, the package assembly comprising:
a pin-out including an array of contacts that are adapted to electrically communicate with the substrate, the array of contacts being arranged at a second pitch that is smaller than the first pitch, the array of contacts including a set of first contacts that are required for the burn-in process and a set of second contacts that are not required for the burn-in process, the set of first contacts being arranged at a pitch that is at least twice as great as the second pitch;
wherein during the burn-in process each of the first contacts is in contact with a corresponding contact member of the burn-in apparatus and the second contacts do not contact any of the contact members of the burn-in apparatus.

15. The package assembly of claim 14 wherein the first pitch is approximately 1.0 millimeters.

16. The package assembly of claim 14 wherein the second pitch is not greater than approximately 0.50 millimeters.

17. The package assembly of claim 14 wherein the second pitch is not greater than approximately 0.25 millimeters.

18. The package assembly of claim 14 wherein the second pitch is not greater than approximately 50 percent of the first pitch.

19. The package assembly of claim 18 wherein at least approximately 64 percent of all of the contacts are second contacts.

20. The package assembly of claim 14 wherein the second pitch is less than 1.0 millimeters.

21. The package assembly of claim 14 wherein at least some of the first contacts are configured to enable a self-test of the package assembly during the burn-in process.

22. The package assembly of claim 21 wherein none of the second contacts is configured to enable a self-test of the package assembly during the burn-in process.

23. A method for manufacturing a package assembly of an integrated circuit package, comprising the step of:
provic an array of contacts of a pin-out on the package assembly, the array of contacts being adapted to electrically communicate with a substrate of the package assembly, the array of contacts including a plurality of first contacts that are required for a burn-in process with a burn-in apparatus and a plurality of second contacts that are not required for the burn-in process;
arranging each of the first contacts to be in contact with a corresponding contact member of the burn-in apparatus, the burn-in apparatus having a plurality of substantially evenly spaced apart contact members that are arranged at a first pitch that is greater than a second pitch of the array of contacts; and
arranging each of the second contacts not to be in contact with any contact members of the burn-in apparatus.

24. The method of claim 23 wherein the second pitch is not greater than approximately 50 percent of the first pitch.

* * * * *